(12) United States Patent
Imayoshi (10) Patent No.: US 10,026,697 B2
(45) Date of Patent: Jul. 17, 2018

(54) WIRING CIRCUIT BOARD, SEMICONDUCTOR DEVICE, METHOD OF MANUFACTURING WIRING CIRCUIT BOARD, AND METHOD OF MANUFACTURING SEMICONDUCTOR DEVICE

(71) Applicant: TOPPAN PRINTING CO., LTD., Tokyo (JP)

(72) Inventor: Koji Imayoshi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/594,396

(22) Filed: May 12, 2017

(65) Prior Publication Data
US 2017/0250141 A1    Aug. 31, 2017

Related U.S. Application Data

(63) Continuation of application No. PCT/JP2015/005144, filed on Oct. 9, 2015.

(30) Foreign Application Priority Data

Nov. 14, 2014 (JP) ................................ 2014-231842

(51) Int. Cl.
*H01L 23/00* (2006.01)
*H01L 23/498* (2006.01)
(Continued)

(52) U.S. Cl.
CPC .......... *H01L 23/562* (2013.01); *H01L 21/486* (2013.01); *H01L 21/4853* (2013.01);
(Continued)

(58) Field of Classification Search
CPC . H01L 23/562; H01L 21/4857; H01L 21/486; H01L 23/15; H01L 23/49822;
(Continued)

(56) References Cited

U.S. PATENT DOCUMENTS

2014/0144681 A1* 5/2014 Pushparaj ........... C03C 17/3435
174/257
2015/0250058 A1* 9/2015 Ramachandran . H01L 21/28008
361/748

FOREIGN PATENT DOCUMENTS

JP        2000-332168 A    11/2000
JP        2001-102479 A    4/2001
(Continued)

OTHER PUBLICATIONS

International Search Report for International Patent Application No. PCT/JP2015/005144 dated Dec. 15, 2015.

*Primary Examiner* — Walter H Swanson
(74) *Attorney, Agent, or Firm* — Foley & Lardner LLP (57) ABSTRACT

A wiring circuit board is provided which can dissipate some heat generated by the driving of a semiconductor element due to thermal conduction to help control temperature rise of the semiconductor element to be an allowable temperature or less, thereby ensuring higher reliability The wiring circuit board includes a base material having a through hole, an insulative resin layer laminated on the base material and having a conductive via formed therein, and a wiring group laminated on the insulative resin layer, wherein an inorganic adhesive layer is formed in the through hole, a hollow through electrode is formed by laminating a conductive layer on the inorganic adhesive layer, a filling resin with higher thermal conductivity than that of the base material is filled in the through electrode, and upper and lower ends of the through electrode are covered with a conductive layer.

10 Claims, 5 Drawing Sheets

(51) Int. Cl.
*H01L 23/373* (2006.01)
*H01L 21/48* (2006.01)

(52) U.S. Cl.
CPC ...... *H01L 21/4857* (2013.01); *H01L 23/3737* (2013.01); *H01L 23/49822* (2013.01); *H01L 23/49827* (2013.01); *H01L 23/49838* (2013.01); *H01L 23/49866* (2013.01); *H01L 23/49894* (2013.01); *H01L 24/16* (2013.01); *H01L 2224/16227* (2013.01); *H01L 2924/35121* (2013.01)

(58) Field of Classification Search
CPC ........... H01L 23/49827; H01L 21/4853; H01L 23/49838; H01L 23/49866; H01L 23/49894; H01L 24/16; H01L 2224/73204
See application file for complete search history.

(56) References Cited

FOREIGN PATENT DOCUMENTS

| | | |
|---|---|---|
| JP | 2002-261204 A | 9/2002 |
| JP | 2002-373962 A | 12/2002 |
| JP | 2007-059452 A | 3/2007 |
| JP | 2008-205356 A | 9/2008 |
| JP | 2012-114400 A | 6/2012 |
| JP | 2013-521663 A | 6/2013 |

\* cited by examiner

WIRING CIRCUIT BOARD, SEMICONDUCTOR DEVICE, METHOD OF MANUFACTURING WIRING CIRCUIT BOARD, AND METHOD OF MANUFACTURING SEMICONDUCTOR DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2015/005144, filed on Oct. 9, 2015, which is based upon and claims the benefit of priority of Japanese Patent Application No. 2014-231842, filed on Nov. 14, 2014, the entireties of which are hereby incorporated by reference.

TECHNICAL FIELD

The present invention relates to wiring circuit boards (interposers) and semiconductor devices, particularly to a wiring circuit board provided between a package substrate and a semiconductor element, and to a semiconductor device provided with a wiring circuit board to be connected to a semiconductor element.

BACKGROUND

Package substrates are used to connect a fine pitch semiconductor element to an external substrate such as a daughter board. Such package substrates are formed of a material such as ceramics or resins.

Since a ceramic package substrate uses a sintered metallized material, the resistance can be high. Further, since ceramics have a high dielectric constant, it is difficult to mount a high-frequency and high-performance semiconductor element to the ceramic package substrate. On the other hand, since a resin package substrate uses copper wiring obtained by plating, the wiring resistance can be decreased. Since resins have a low dielectric constant, it is relatively easy to mount a high-frequency and high-performance semiconductor element to the resin package substrate.

There are techniques for interposing an interposer (wiring circuit board) between the package substrate and a semiconductor element, for example, as described in PTLs 1 to 4.

In recent years, interposers in which silicon or glass is used as a material for a substrate have been thoroughly studied and have attracted attention as high-end interposers. Such interposers using silicon or glass as a base material are characterized by the use of techniques called TSV (through-silicon via) or TGV (through-glass via) for forming a through hole inside the substrate to fill the through hole with a conductive material. A through electrode formed by such a technique has a reduced wiring length because the front and back surfaces are connected by a minimum distance, thereby allowing for high electrical properties such as high speed signal transmission.

Such a through electrode has a coefficient of linear expansion equal or close to that of the semiconductor element, reduces dimensional changes of the substrate on heating, and enables higher density packaging and higher density wiring. In addition, employment of such a through electrode enables parallel multi-pin connection, and accordingly good electrical properties can be obtained without increasing the speed of LSI. This may allow for lower power consumption.

In particular, glass interposers using glass as a material for the substrate are attracting attention in recent years. Among other things, the use of such glass interposers is expected to lead to cost reduction. Although silicon interposers are manufactured only in a wafer size, glass interposers can be mass-processed using a large-sized panel. This may help to solve cost issues, which have been a major problem of high-end interposers.

CITATION LIST

Patent Literature

PTL 1: JP 2001-102479 A
PTL 2: JP 2002-373962 A
PTL 3: JP 2002-261204 A
PTL 4: JP 2000-332168 A

SUMMARY OF THE INVENTION

Technical Problem

Unfortunately, in designing glass interposers, there are some problems to be overcome. One of such problems is that since glass substrates have a low thermal conductivity and conductive materials of achieving adhesion to glass are limited, the heat of the semiconductor element is insufficiently dissipated, thereby inhibiting driving of the semiconductor element, or due to the difference in CTE (coefficient of thermal expansion) between the semiconductor element and the component material for the glass interposer, the electrical connection therebetween may be broken. In addition, the glass interposers may create a phenomenon that a conductive layer pattern made of copper or the like is detached from the surface of the glass in a high temperature process during mounting or in a temperature cycle of reliability tests.

The present invention has been made to solve the problem set forth above, and has an object to provide a wiring circuit board, a semiconductor device, a method of manufacturing a wiring circuit board, and a method of manufacturing a semiconductor device which can efficiently dissipate heat generated from a semiconductor element to improve adhesion between a glass substrate and a conductive layer pattern, thereby having higher reliability.

Solution to Problem

A wiring circuit board according to the present invention has a base material having a through hole, an insulative resin layer laminated on the base material and having a conductive via formed therein, and a wiring group laminated on the insulative resin layer, and the wiring circuit board includes an inorganic adhesive layer formed in the through hole, a hollow through electrode formed by laminating a first conductive layer on the inorganic adhesive layer, a filling resin formed by filling a mixture of a metallic powder and a resin material in the through electrode, and a second conductive layer covering upper and lower ends of the through electrode.

A semiconductor device according to the present invention includes the above wiring circuit board and a semiconductor element mounted on the wiring circuit board.

A method of manufacturing a wiring circuit board according to the present invention includes the steps of: forming a through hole in a base material; forming a first inorganic adhesive layer made of an inorganic material on both surfaces of the base material and an inner peripheral surface of the through hole; forming a hollow through electrode in the through hole by laminating a first conductive layer made of a conductive material on the first inorganic adhesive layer; filling a filling resin composed of a mixture of a metallic powder and a resin material in the through electrode; thinning the first conductive layer laminated on both surfaces of the base material; forming a second conductive layer made of a conductive material to cover both ends of the first conductive layer in the through hole to cover upper and lower ends of the through electrode and to form a first wiring group; forming an insulative resin layer covering the first wiring group; forming a via hole in a portion of the insulative resin layer on the first wiring group; and forming a second wiring group made of a conductive material, and a conductive via in the insulative resin layer.

Another method of manufacturing a wiring circuit board according to the present invention may include the steps of: forming a through hole in a base material; forming a first inorganic adhesive layer made of an inorganic material on both surfaces of the base material and an inner peripheral surface of the through hole; forming a hollow through electrode in the through hole by laminating a first conductive layer made of a conductive material on the first inorganic adhesive layer; filling a filling resin composed of a mixture of a metallic powder and a resin material in the through electrode; removing the first inorganic adhesive layer and the first conductive layer laminated on both surfaces of the base material; forming a second inorganic adhesive layer made of an inorganic material on both surfaces of the base material and the through electrode; forming a second conductive layer made of a conductive material on the second inorganic adhesive layer, covering upper and lower ends of the through electrode and forming a first wiring group; forming an insulative resin layer covering the first wiring group; forming a via hole in a portion of the insulative resin layer on the first wiring group; and forming a second wiring group made of a conductive material, and a conductive via in the insulative resin layer.

A method of manufacturing a semiconductor device according to the present invention includes the steps of: forming a wiring circuit board according to any one of the above methods of manufacturing a wiring circuit board; forming a conductive pad on the wiring circuit board; and fixing a semiconductor element on the conductive pad.

Advantageous Effects of the Invention

According to the present invention, efficient heat dissipation of a semiconductor element through a wiring circuit board enables suppression of a temperature rise of a semiconductor element and stabilization of driving. Further, according to the present invention, it is possible to provide a wiring circuit board, a semiconductor device, a method of manufacturing a wiring circuit board, and a method of manufacturing a semiconductor device by preventing detachment of a conductive layer pattern due to thermal expansion and thermal contraction, thereby ensuring higher reliability.

DESCRIPTION OF REPRESENTATIVE EMBODIMENTS

With reference to the drawings, embodiments of the present invention will be described.

First Embodiment

With reference to FIGS. 1 to 9, a first embodiment of the present invention will be described.

(Configuration of Wiring Circuit Board 100)

Figure 1:
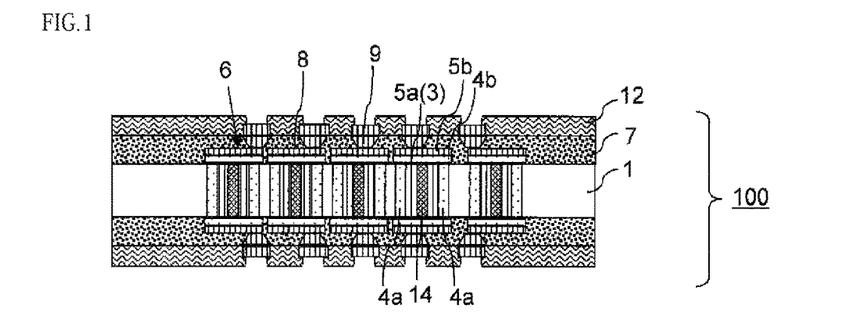
FIG. 1 is a cross-sectional view illustrating a configuration of a wiring circuit board in a first embodiment of the present invention.

As shown in FIG. 1, a wiring circuit board (glass interposer) 100 is provided with a substrate 1, through electrodes 3, inorganic adhesive layers 4a and 4b, conductive layers (conductive layer patterns) 5a and 5b, lands 6, an insulative resin layer 7, a wiring group 8, conductive vias 9, and a filling resin 14. As the through electrode 3, a through hole for ensuring electrical continuity and a thermal via for conducting heat are formed. The diameter of a through hole 13 for forming the through electrode 3 is not specifically limited, and the thermal via is desirably formed with a large diameter within the acceptable range for designing the wiring circuit board.

The base material 1 is a substrate composed of glass (glass substrate) containing $SiO_2$ as a main component, and includes the through hole 13.

The glass substrate has a thermal conductivity in the range of 0.55 to 0.75 W/m·k and the insulative resin has a thermal conductivity of 0.6 W/m·k or less, which are both relatively low. Cu used for the conductive layers 5 has a high thermal conductivity that is in the range of 80 to 400 W/m·k. The filling resin 14 of the present invention has a thermal conductivity that is in the range of 1 to 20 W/m·k, thereby achieving a thermal conductivity effect 2 to 40 times that of the insulative resin. The thermal conductivities were measured with a laser flash thermal constant analyzer in compliance with JIS:R1611, JIS:R1650-3, and JIS:H7801.

The base material 1 has a coefficient of thermal expansion, which is in the range of 3 to 4 ppm/° C. for low expansion glass and in the range of 8 to 9 ppm/° C. for soda lime glass, and can be controlled so as to be in the range of 3 to 9 ppm/° C. by the manufacturing method used or by adding metal components, such as Na. The coefficients of thermal expansion were measured in compliance with JIS:R3102 and JIS:K7197 by using a TMA (thermomechanical analysis).

In the method of forming the through hole 13 in the base material 1, one can use $CO_2$ laser, UV laser, pico-second laser, femto-second laser, excimer laser, electric discharge machining, photosensitive glass, blast machining, or the like, which may be selected depending on the thickness of the base material 1 or the diameter of the through hole 13. When photosensitive glass is irradiated with ultraviolet rays, a metal colloid is formed inside, thereby improving solubility in hydrofluoric acid. This is a material capable of forming a through hole by using a difference in solubility in a glass degradation liquid between an irradiated portion and non-irradiated portion.

Materials of the inorganic adhesive layers 4a and 4b include materials achieving high adhesiveness between the base material 1 and the conductive material, such as tin oxide, indium oxide, zinc oxide, nickel (coefficient of thermal expansion: 15 ppm/° C.), nickel phosphorus, chromium (coefficient of thermal expansion: 8 ppm/° C.), chromium oxide, aluminum nitride, copper nitride, aluminum oxide, tantalum (coefficient of thermal expansion: 6 ppm/° C.), titanium (coefficient of thermal expansion: 9 ppm/° C.), and copper (coefficient of thermal expansion: 16 ppm/° C.).

The above materials of the inorganic adhesive layers 4a and 4b can be used alone or as a single layer formed of a composite material containing two or more of the above materials, such as an ITO film (coefficient of thermal expansion: 9 ppm/° C.). Further, the above materials of the inorganic adhesive layer 4 can be used as a laminated film of two or more layers formed of a composite material containing two or more of the above materials, such as a film of chromium/copper or titanium/copper.

The inorganic adhesive layers 4a and 4b are provided to improve adhesion of the base material 1 with the through electrode 3 (conductive layer 5a) and the conductive layer 5b. In addition, since the inorganic adhesive layers 4a and 4b have a coefficient of thermal expansion higher than that of the base material 1, it is possible to reduce stress across the layers caused by the difference in the coefficients of linear expansion of the through electrode 3 (conductive layer 5a) and the conductive layer 5b from the base material 1.

Film thicknesses of the inorganic adhesive layers 4a and 4b are not specifically limited, but may be in the range from 0.1 μm or more to 1 μm or less to obtain adhesion and to achieve the effect of reducing a difference in the coefficients of thermal expansion. Further, methods of forming the inorganic adhesive layers 4a and 4b are not specifically limited, but include sputter deposition, non-electrolytic plating, or the like.

The inorganic adhesive layer 4a corresponds to the first inorganic adhesive layer, and the inorganic adhesive layer 4b corresponds to the second inorganic adhesive layer.

The through electrode 3 is made of a conductive material. The through electrode 3 in a hollow shape is formed of the conductive layer 5a which is formed on the inorganic adhesive layer 4a provided in the through hole 13. Examples of the conductive material forming the through electrode 3 include metals, such as copper, silver, gold, nickel, platinum, palladium, ruthenium, tin, tin silver, tin silver copper, tin copper, tin bismuth, and tin lead, which may be used alone or as a stack or a compound of any of these metals. Materials having high adhesiveness to the inorganic adhesive layers 4 and high electrical connection stability may be selected.

Instead of the conductive layer 5a, the material for the through electrode 3 may be a filling resin which fills the inside of the inorganic adhesive layers 4, i.e. a mixture of a resin material and a powder of at least one of the above forming metals for the first conductive layer 5a, after the inorganic adhesive layer 4 has been formed.

A method of forming the conductive layer 5a may be conformal plating, including non-electrolytic plating and electroplating, for formation. Since the density of semiconductor devices is becoming higher, wiring is becoming finer, and the diameter of the through electrode 3 is becoming smaller. Accordingly, the through electrode 3 has a high aspect ratio, and therefore there is a region not available for filled plating. In the high aspect ratio region, the through electrode 3 may be formed by conformal plating. In the low aspect ratio region, the through electrode 3 may be formed by filled plating.

In the form obtained through conformal plating, a through hole-shaped hole is left at the center of the through hole 13, which may be filled with the filling resin 14 by screen printing.

In the form obtained through filled plating, thicker conductive layer 5a (first conductive layer) is laminated on both surfaces of the base material 1. Hence, the conductive layer 5a laminated on both surfaces of the base material 1 may be thinned to form fine wiring on the base material 1. At this point, it may be so configured that the surface of the base material 1 is polished to expose the upper and lower ends of the through electrode 3, followed by laminating the inorganic adhesive layer 4b (second inorganic adhesive layer) and the conductive layer 5b (second conductive layer) on the base material 1 to form a wiring group (refer to FIGS. 3 to 9).

The conductive layer 5b is made of a conductive material and is formed on both surfaces of the base material 1 via the inorganic adhesive layer 4b. Examples of the conductive material forming the conductive layer 5b include metals, such as copper, silver, gold, nickel, platinum, palladium, ruthenium, tin, tin silver, tin silver copper, tin copper, tin bismuth, and tin lead, which may be used alone or as a laminate or a compound of any of the metals. Materials having high adhesiveness to the inorganic adhesive layers 4b and high electrical connection stability may be selected.

In addition, examples of the conductive material forming the conductive layer 5b may be a conductive paste that is a mixture of a resin material and a powder of at least one metal of the above materials. Further, methods of forming the conductive layer 5 are not specifically limited, but include non-electrolytic plating and electroplating.

The land 6 is formed on the upper and lower ends of the through electrode 3 or on the wiring routed from the through electrode 3 via the conductive layer 5b. The land 6 may be at the same level, for example, as the surface of the base material 1, or may be at a level higher, by several microns, than the surface of the base material 1.

As shown in FIGS. 3 to 9, the wiring group may be formed by filling the through hole 13 with the filling resin 14, followed by polishing the conductive layer 5b laminated on both surfaces of the base material 1 and the filling resin 14 filled in the through hole 13, down to the level of the surface of the base material 1 for removal of the layer and resin to expose the upper and lower ends of the through electrode 3, and then laminating the inorganic adhesive layer 4b (second inorganic adhesive layer) and the conductive layer 5b (second conductive layer 5) on the base material 1. The method of forming the wiring group is not specifically limited, but may be a method in which the conductive layer 5b is formed, followed by covering a portion to be a wiring circuit with a photosensitive resist, and etching and removing the uncovered portion. As another example, the wiring group may be formed by forming the inorganic adhesive layer 4b, followed by opening a portion to be a wiring circuit in the photosensitive resist to form the conductive layer 5b in the opening, and then removing the photosensitive resist and the inorganic adhesive layer 4b.

The insulative resin layer 7 is formed on the conductive layer 5b. A necessary number of the insulative resin layers 7 are stacked. The number of the insulative resin layers 7 may be decided depending on, for example, the design of the product.

Materials of the insulative resin layer 7 include an epoxy/phenol resin, a polyimide resin, a cycloolefin, and a PBO resin, which can be used alone or as a composite material containing at least two or more of these materials. In this case, for example, the material of the insulative layer 7 may have a coefficient of thermal expansion in the range of 30 to 100 ppm/° C., which is higher than that of the conductive material, and may have a high elastic modulus to cover the conductivity layer 5b for reduction of the stress applied between the layers of the conductive layer 5b and the substrate 1, thereby exerting an effect of preventing detachment of the conductive layer 5b.

Examples of the material for the insulative resin layer 7 include, but are not specifically limited to, a dry film and a liquid photo solder resist.

In the wiring group 8, a necessary number of layers are stacked. The number of layers of the wiring group 8 may be decided depending on, for example, the design of the product. Methods of forming the wiring group 8 are not specifically limited, but the wiring group 8 may be formed by using non-electrolytic plating layer or a sputtered film as a seed layer, and thickening by electrolytic plating, followed by patterning using a semi-additive process or a subtractive process.

The conductive via 9 is formed in the insulative resin layer 7 so as to electrically connect the conductive layer 5 to the wiring group 8. The conductive via 9 is formed by a process of filling the via hole formed in the insulative resin layer 7 with a conductive material, such as conformal plating.

Methods of forming the via hole in the insulative resin layer 7 may be selected depending on, for example, the material of the insulative resin layer 7. When the material of the insulative resin layer 7 is a heat-curable resin, the via hole may be formed by a process using a $CO_2$ laser, UV laser, or the like, which is followed by a desmearing process to remove smears generated in the laser process. When the material of the insulative resin layer 7 is a photosensitive resist, the via hole may be formed by photolithography.

As described above, the wiring circuit board 100 of the present embodiment is a multi-layer interposer having through electrodes. According to the wiring circuit board 100 of the present embodiment, higher conductive reliability is achieved between the wiring groups 8 formed on both surfaces of the base material 1. The necessary numbers of layers of the insulative resin layer 7 and the wiring group 8, and the shape and the height of the metal layer of the conductive pad shown in FIG. 1, are merely examples, and not specifically limited thereto.

(Configuration of Semiconductor Device 200)

Figure 2:
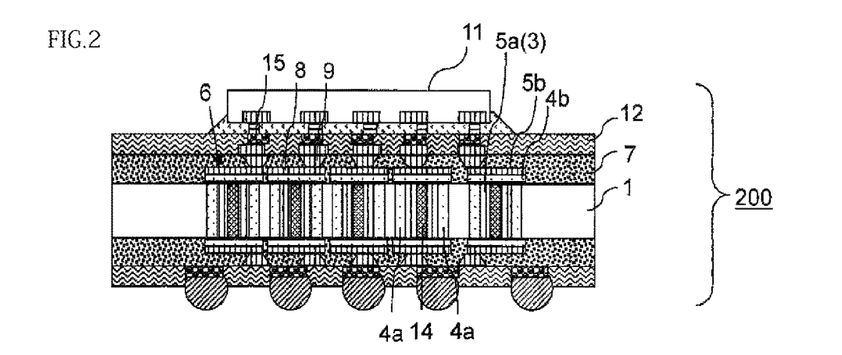
FIG. 2 is a cross-sectional view illustrating a configuration of a semiconductor device in the first embodiment of the present invention.

As shown in FIG. 2, a semiconductor device 200 is provided with the wiring circuit board 100 and a semiconductor element 11. The wiring circuit board 100 is mounted on a printed board, not shown, by using solder balls.

The semiconductor element 11 is mounted on one surface (upper surface in FIG. 2) of the wiring circuit board 100 by using solder balls, not shown. The shape of the semiconductor element 11 or a connection method between the semiconductor element 11 and the wiring circuit board 100 shown in FIG. 2 are merely examples, and not specifically limited thereto.

As described above, according to the semiconductor device 200 of the present embodiment, the heat generated by the semiconductor element 11 is more highly effectively dissipated toward the printed board side via the through electrode 3 of the wiring circuit board 100 by optimizing the material of the filling resin 14 in the through electrode 3 between the wiring circuit board 100 and the semiconductor element 11 to be connected thereto. Furthermore, more highly reliable connection can be obtained by preventing the wiring group 8 from being detached from the substrate 1 during mounting.

Second Embodiment

With reference to FIGS. 10 to 16, a second embodiment of the present invention will be described.

As shown in FIGS. 10 to 16, a wiring circuit board according to the present embodiment is formed by filling the inside of the through hole 13 with the filling resin 14, followed by polishing the first conductive layer 5 and the filling resin 14 filled in the through hole 13 to remove of the layer and resin to thin the conductive layer 5a, and then laminating a conductive layer 5c (second conductive layer) on the base material 1. The method of forming a wiring group is not specifically limited, but may be a method in which the conductive layer 5c is formed, followed by covering a portion to be a wiring circuit with a photosensitive resist, and etching and removing the uncovered portion. The method of forming the conductive layer 5c and forming materials thereof are the same as those of the conductive layers 5a and 5b described above. Since the method of forming other layers and forming materials of them are the same as those of the first embodiment, repetitive descriptions are omitted.

EXAMPLES

Examples of the present invention will be described in conjunction with a method of manufacturing a wiring circuit board and a method of manufacturing a semiconductor device.

Example 1

With reference to FIGS. 1 and 2, Example 1 will be described in conjunction with FIGS. 3 to 9.

A method of manufacturing a wiring circuit board 100 according to Example 1 includes steps of forming a through hole, forming an inorganic adhesive layer, forming a conductive layer and a through electrode, forming a land, forming an insulative resin layer, forming a via hole, and forming a wiring group and a conductive via.

Figure 3:
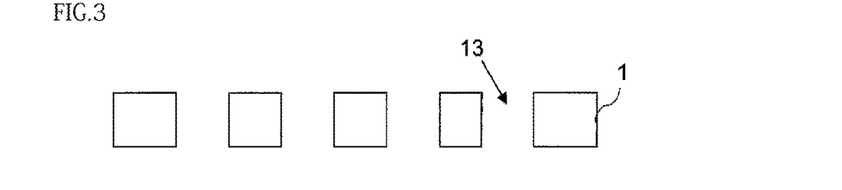
FIG. 3 is a view illustrating a method of manufacturing the wiring circuit board in the first embodiment of the present invention.

As shown in FIG. 3, in the step of forming a through hole, the through hole 13 was first formed in the substrate 1 by pico-second laser. As the substrate 1, a rectangular low expansion glass (coefficient of thermal conductivity: 0.7 W/m·k) having a thickness of 0.3 mm, and a size of 200 mm×200 mm was used. As the through hole 13, a hole for achieving electrical conductivity and a thermal via for achieving thermal conductivity were formed. The diameters of the hole and the thermal via were 50 µmΦ and 100 µmΦ at the top, respectively.

Figure 4:
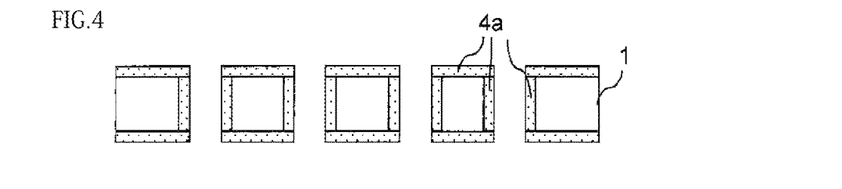
FIG. 4 is a view illustrating the method of manufacturing the wiring circuit board in the first embodiment of the present invention.

As shown in FIG. 4, in the step of forming an inorganic adhesive layer, a 0.05 µm thick sputtered Ti film and a 0.2 µm thick sputtered Cu film were continuously deposited on the surfaces of the base material 1 to form the inorganic adhesive layer 4a (first inorganic adhesive layer) on the surfaces of the base material 1 and in the through hole 13.

Figure 5:
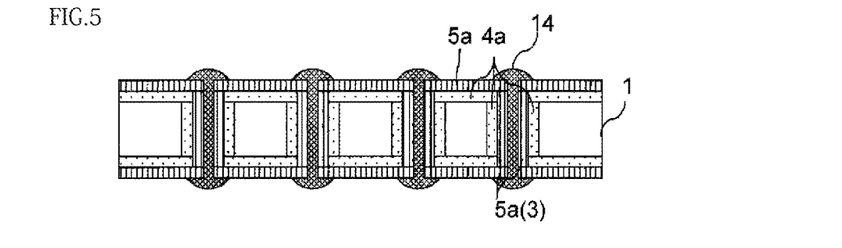
FIG. 5 is a view illustrating the method of manufacturing the wiring circuit board in the first embodiment of the present invention.

As shown in FIG. 5, in the step of forming a conductive layer/through electrode, the conductive layer 5a was formed. More specifically, the conductive layer 5a was formed on the inorganic adhesive layer 4a on both surfaces of the base material 1 by electrolytic copper plating (coefficient of thermal conductivity: 40 W/m·k) using a conductive material. In addition, the through electrode 3 (conductive layer 5a) was formed in the through hole 13 by conformal copper plating. The thickness of the conductive layer 5a was 6 µm. Further, the through-hole of the through electrode 3 was filled with a conductive paste (coefficient of thermal conductivity: 10 W/m·k) composed of a mixture of silver and, copper powders, and an organic resin by vacuum printing, followed by curing, thereby forming the filling resin 14.

Figure 6:
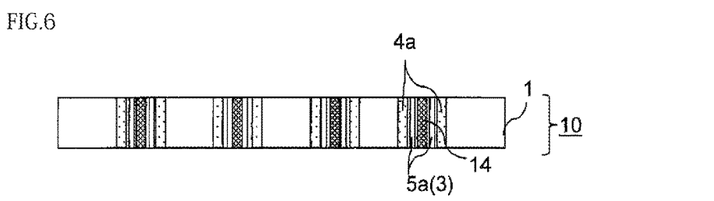
FIG. 6 is a view illustrating the method of manufacturing the wiring circuit board in the first embodiment of the present invention.
Figure 7:
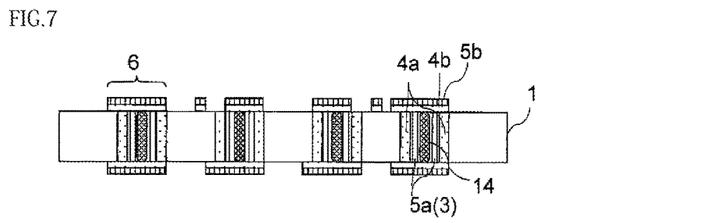
FIG. 7 is a view illustrating the method of manufacturing the wiring circuit board in the first embodiment of the present invention.

As shown in FIG. 6, in the step of forming a land, both surfaces of the substrate 1 were first polished by chemical polishing using the glass surface of the substrate 1 as a stopper layer to remove the conductive layer 5a, the inorganic adhesive layer 4a, and the conductive paste (filling resin 14) protruding from the through hole 13, all of which were formed on the both surfaces of the base material 1. Then, a plating layer (conductive layer 5b) was formed to serve as a lid for the filling resin 14 filled in the through hole of the through electrode 3. More specifically, similar to the inorganic adhesive layer 4a, a 0.05 µm thick sputtered Ti film and a 0.2 µm thick sputtered Cu film were continuously disposed on both surfaces of the substrate 1 to form an inorganic adhesive layer 4b (second inorganic adhesive layer). A photosensitive resist pattern in which a land pattern 6 was open was formed by a semi-additive process, followed by forming a 5 µm thick electrolytic copper plating layer (conductive layer 5b) on the base material 1. Then, as shown in FIG. 7, the photosensitive resist was detached, and the laminated film of Ti and Cu of the inorganic adhesive layer 4b in the portion other than the land pattern 6 on the surface of the base material 1 was wet etched to form a core substrate 10 with the through electrode 3 arranged in the base material 1.

Figure 8:
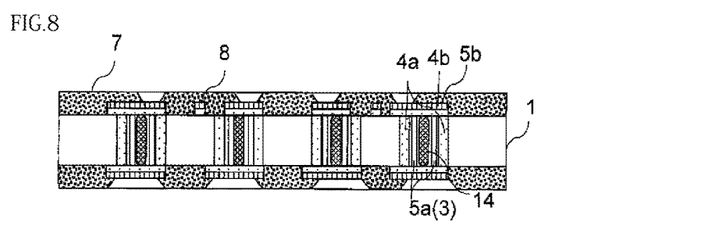
FIG. 8 is a view illustrating the method of manufacturing the wiring circuit board in the first embodiment of the present invention.

As shown in FIG. 8, in the steps of forming an insulative resin layer/a via hole, the insulative resin 7 was formed by laminating an ABF film (manufactured by Ajinomoto Fine-Techno Co., Inc.) made of an epoxy resin on both surfaces of the core substrate 10. After lamination, the via hole was formed in the insulative resin layer 7 on top of the through electrode 3 by using a UV-YAG laser. The diameter of the via hole was smaller than that of the through electrode 3. Furthermore, smears generated in the via hole during UV-YAG laser processing were cleaned by desmearing using an alkaline aqueous treatment solution.

In the step of forming a wiring group and a conductive via, the conductive via 9 was formed by filling the inside of the via hole formed in the insulative resin 7 with copper by conformal plating. For the wiring group 8, a non-electrolytic copper plating layer was formed as a seed layer on the insulative resin 7. Further, on the seed layer, a resist pattern in which a portion corresponding to a wiring group 8 (refer to FIG. 9) was open was formed by a negative resist. Then, using a semi-additive process, a 6 µm thick electrolytic copper plating layer was formed as a conductive material. After that, the resist and unnecessary portions of the seed layer were removed to form the wiring group 8. An LS (line space) of the wiring group was set to 6 µm.

Figure 9:
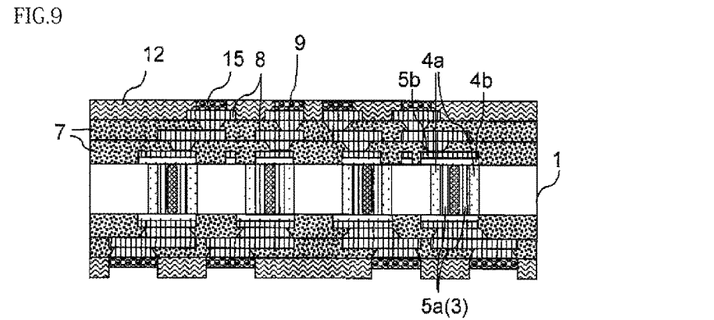
FIG. 9 is a view illustrating the method of manufacturing the wiring circuit board in the first embodiment of the present invention.

Then, as shown in FIG. 9, the steps described in FIGS. 8 and 9 were repeated according to the necessary numbers of wiring layers to form, on the base material 1, a multilayer wiring layer in which each wiring group 8 is connected to the insulative resin 7, and the wiring groups 8 are electrically connected with each other through the conductive vias 9.

A method of manufacturing a semiconductor device 200 of Example 1 included steps of forming a conductive pad 15 on the wiring circuit board 100 produced by the above method of manufacturing a wiring circuit board, and fixing the semiconductor element 11 on the conductive pad.

In the step of forming a conductive pad, a photosensitive solder resist 12 was laminated on the substrate 1 for light exposure and development, and the conductive pad 15 was formed by Ni/Au plating.

In the step of fixing a semiconductor element, the semiconductor element 11 was fixed onto the conductive pad 15 by soldering.

In Example 1, the wiring group 8 on one surface was formed of two layers, the solder resist 12 was provided as a surface coating layer, and the surface of the conductive pad 15 was treated with Ni/Au. However, the configurations are not specifically limited thereto.

Example 2

Example 2 of the present invention will be described in conjunction with FIGS. 1, and 2, and FIGS. 10 to 16.

A method of manufacturing a wiring circuit board 100 of Example 2 includes steps of forming a through hole, forming an inorganic adhesive layer, forming a conductive layer and through electrode, forming a land, forming an insulative resin layer, forming a via hole, and forming a wiring group and conductive via.

Figure 10:
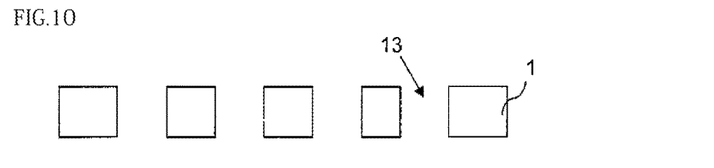
FIG. 10 is a view illustrating a method of manufacturing a wiring circuit board in a second embodiment of the present invention.

As shown in FIG. 10, in the step of forming a through hole, the through hole 13 was first formed in the substrate 1 by picosecond laser. As the substrate 1, a rectangular low expansion glass (coefficient of thermal conductivity: 0.7 W/m·k) having a thickness of 0.3 mm and a size of 200 mm×200 mm was used. As shown in FIG. 10, as the through hole 13, a hole for achieving electrical conductivity and a thermal via for achieving thermal conductivity were formed, and the diameters of the hole and the thermal via were 50 μmΦ and 100 μmΦ at the top, respectively.

Figure 11:
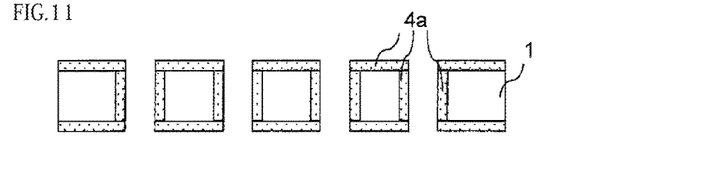
FIG. 11 is a view illustrating the method of manufacturing the wiring circuit board in the second embodiment of the present invention.

Next, as shown in FIG. 11, in the step of forming an inorganic adhesive layer, a 0.05 μm thick sputtered Ti—Ni—Cu alloy film and a 0.2 μm thick sputtered Cu film were continuously formed on both sides of the base material 1 to form an inorganic adhesive layer 4a on the surfaces of the base material 1 and inside the through hole 13.

Figure 12:
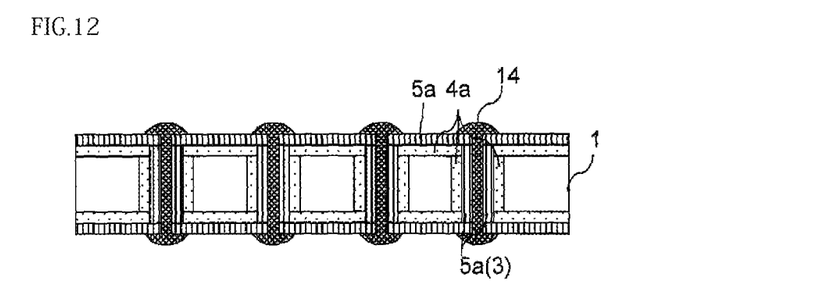
FIG. 12 is a view illustrating the method of manufacturing the wiring circuit board in the second embodiment of the present invention.

Next, as shown in FIG. 12, in the step of forming a conductive layer/through electrode, the conductive layer 5a was formed. More specifically, the conductive layer 5a was formed on the inorganic adhesive layer 4a on both surfaces of the substrate 1, by electrolytic copper plating (coefficient of thermal conductivity: 40 W/m·k) using a conductive material. In addition to that, the through electrode 3 (conductive layer 5a) was formed in the through hole 13 by conformal plating to fill the through hole 13 with copper plating. The thickness of the conductive layer 5a was 8 μm. Further, the through-hole of the through electrode 3 was filled with a conductive paste (coefficient of thermal conductivity: 10 W/m·k) composed of a mixture of silver, a copper powder, and an organic resin by vacuum printing, followed by curing, thereby forming the filling resin 14.

Figure 13:
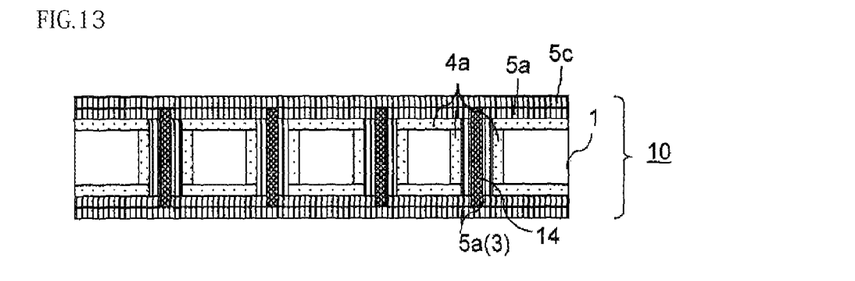
FIG. 13 is a view illustrating a method of manufacturing a printed circuit board in the second embodiment of the present invention.
Figure 14:
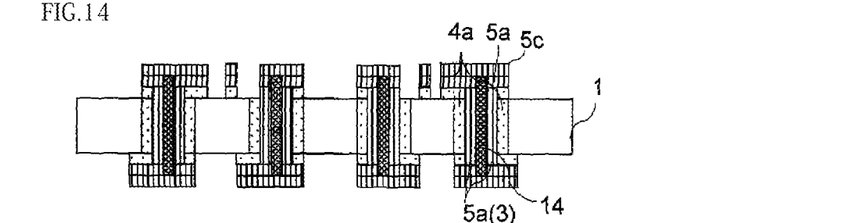
FIG. 14 is a view illustrating the method of manufacturing the printed circuit board in the second embodiment of the present invention.

Next, in the step of forming a land, the laminate on the substrate 1 were polished by chemical polishing until the thickness thereof became 3 μm to remove the conductive paste protruding from the through hole 13. Then, electrolytic copper plating was applied over the conductive paste for the through-hole portion to form a 5 μm thick conductive layer 5c serving as a lid, on the surface of the base material 1, as shown in FIG. 13. Further, in the step of forming a land, to form the land 6 on both ends of the through electrode 3, a resist pattern was formed, as shown in FIG. 14, by a subtractive process such that the land 6 was covered with the photosensitive resist. Then, the copper plating layer (conductive layer 5c) on the surface of the base material 1 except for the land 6 and the Ti—Ni—Cu alloy film of the inorganic adhesive layer 4a were wet etched. Thus, a core substrate 10 having the through electrode 3 arranged in the base material 1 was formed.

Figure 15:
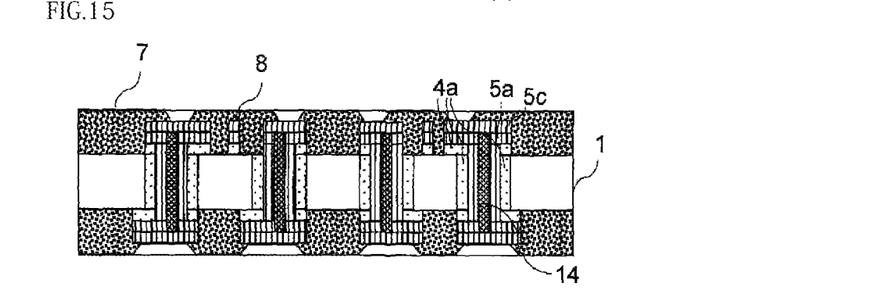
FIG. 15 is a view illustrating the method of manufacturing the printed circuit board in the second embodiment of the present invention.
Figure 16:
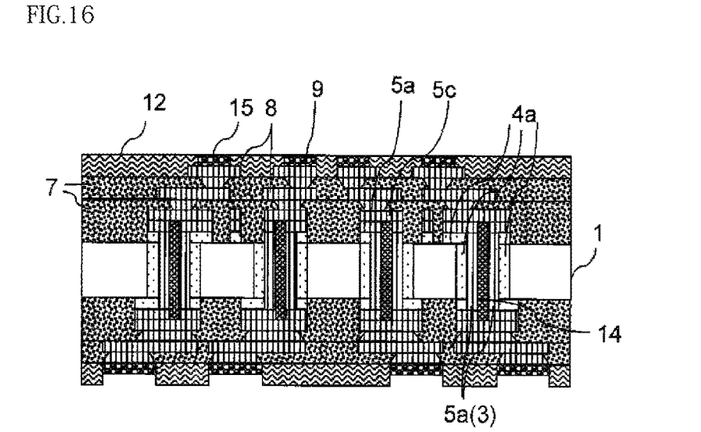
FIG. 16 is a view illustrating the method of manufacturing the printed circuit board in the second embodiment of the present invention.

Next, as shown in FIG. 15, in the steps of forming an insulative resin layer and a via hole, the insulative resin layer 7 was formed by laminating an ABF film (manufactured by Ajinomoto Fine-Techno Co., Inc.) made of an epoxy resin on both surfaces of the core substrate 10. Then, a via hole was formed in the insulative resin layer 7 on top of the through electrode 3 by using a UV-YAG laser. The diameter of the via hole was smaller than that of the through electrode 3. Furthermore, smears generated in the via hole during UV-YAG laser processing were cleaned by desmearing using an alkaline aqueous treatment solution.

Then, in the step of forming a wiring group/conductive via, the conductive via 9 was formed by filling the inside of the via hole formed in the insulative resin 7 by conformal copper plating. For the wiring group 8, a non-electrolytic copper plating layer was formed as a seed layer on the insulative resin 7. Further, on the seed layer, a resist pattern in which a portion corresponding to wiring group 8 (refer to FIG. 16) was open was formed by a negative resist. Then, using a semi-additive process, an 8 μm thick electrolytic copper plating layer was formed as a conductive material. After that, the resist and unnecessary portion of the seed layer were removed to form the wiring group 8. An LS (line space) of the wiring group was set to 10 μm.

A method of manufacturing a semiconductor device 200 in Example 2 of the present invention included steps of forming a conductive pad 15 on the wiring circuit board 100 produced by the above method of manufacturing a wiring circuit board, and fixing the semiconductor element 11 on the conductive pad.

In the step of forming a conductive pad, a photosensitive solder resist 12 was laminated on the substrate 1 for light exposure and development, followed by Ni/Au plating to form the conductive pad 15.

In the step of fixing a semiconductor element, the semiconductor element 11 was fixed onto the conductive pad 15 by soldering.

In Example 2, the wiring group 8 on one surface was formed of two layers, the solder resist 12 was provided as a surface coating layer, and the surface of the conductive pad was treated with Ni/Au. However, the configurations are not particularly limited thereto.

Comparative Example 1

Comparative example 1 will be described in conjunction with FIGS. 17 to 23.

Figure 17:
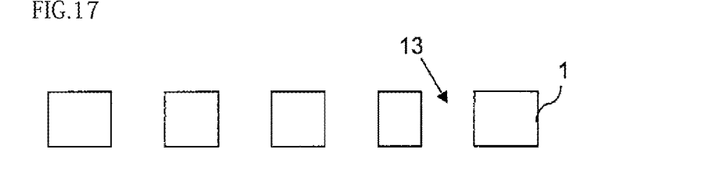
FIG. 17 is a view illustrating a method of manufacturing a printed circuit board in a comparative example.

As shown in FIG. 17, in a method of manufacturing the wiring circuit board 100 of Comparative example, a through hole 13 was first formed in a substrate 1 by picosecond laser. As the substrate 1, a rectangular low expansion glass (coefficient of thermal conductivity: 0.7 W/m·k) having a thickness of 0.3 mm, and a size of 200 mm×200 mm was used. As the through hole 13, a hole for achieving electrical conductivity and a thermal via for achieving thermal conductivity were formed. The diameters of the hole and the thermal via were 50 and 100 at the top, respectively.

Figure 18:
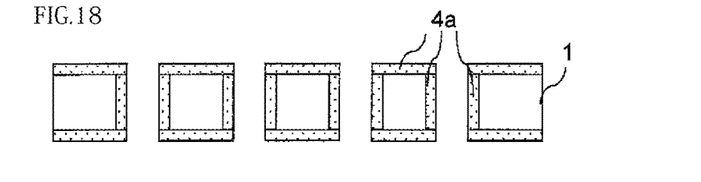
FIG. 18 is a view illustrating the method of manufacturing the printed circuit board in the comparative example.

Next, as shown in FIG. 18, a 0.05 μm thick Ti film and a 0.2 μm thick Cu film were deposited on both surfaces of the base material 1 by sputtering to form an inorganic adhesive layer 4a on the surfaces of the base material 1 and in the through hole 13.

Figure 19:
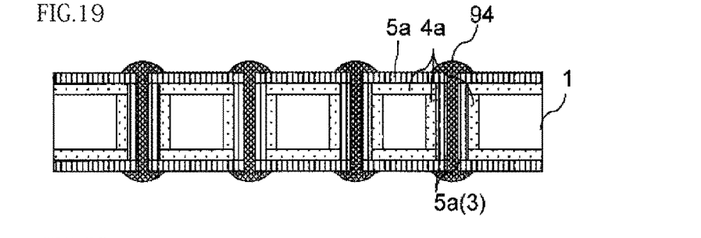
FIG. 19 is a view illustrating the method of manufacturing the printed circuit board in the comparative example.

Then, as shown in FIG. 19, a conductive layer 5a was formed on the inorganic adhesive layer 4a. More specifically, the conductive layer 5a was formed on both surfaces of the base material 1 by electrolytic copper plating (coefficient of thermal conductivity: 40 W/m·k) using a conductive material. In addition to that, the through electrode 3 (conductive layer 5a) was formed in the through hole 13 by conformal copper plating. The thickness of the conductive layer 5a was 6 μm. Further, the through-hole of the through electrode 3 was filled with a filling resin 94 (coefficient of thermal conductivity: 0.6 W/m·k) composed of a mixture of an organic resin and a silicon oxide filler by vacuum printing, followed by curing.

Figure 20:
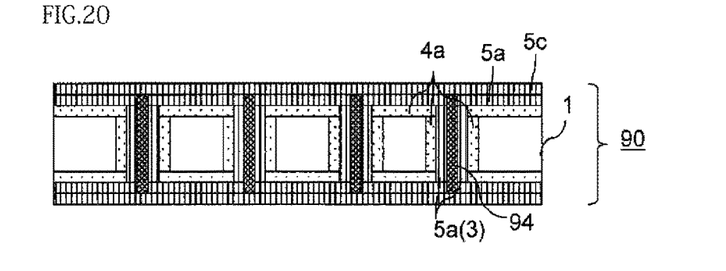
FIG. 20 is a view illustrating the method of manufacturing the printed circuit board in the comparative example.

Then, as shown in FIG. 20, the laminate on the base material 1 were polished by chemical polishing until the thickness thereof became 3 μm to remove the filling resin 14 protruding from the through hole 13. Then, a 5 μm thick electrolytic copper plating layer (conductive layer 5c) was formed on a surface of the base material 1 to serve as a lid for the filling resin 94 of the through hole.

Figure 21:
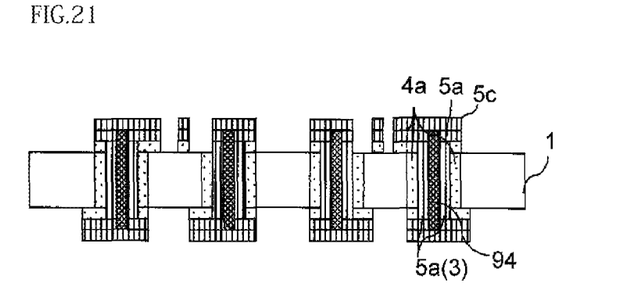
FIG. 21 is a view illustrating the method of manufacturing the printed circuit board in the comparative example.

Then, as shown in FIG. 21, a resist pattern was formed by a photosensitive resist covering a wiring group 8 in order to form the wiring group 8 electrically connected to the through electrode 3. Then, wet etching was applied to the electrolytic copper plating layer on the surface of the base material 1 except for the wiring group 8 and the Ti—Cu sputtered film of the inorganic adhesive layer 4a. Thus, a core substrate 90 having the conductive layers 5 and the through electrode 3 in the base material 1 was formed.

Figure 22:
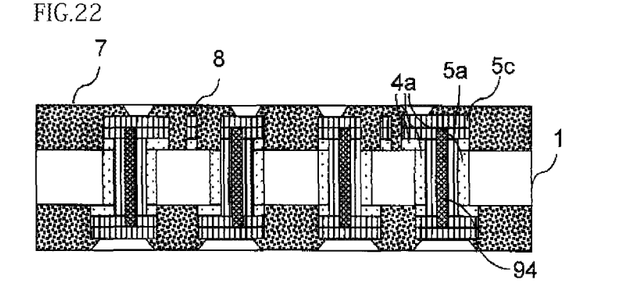
FIG. 22 is a view illustrating a method of manufacturing a wiring circuit board in the comparative example.
Figure 23:
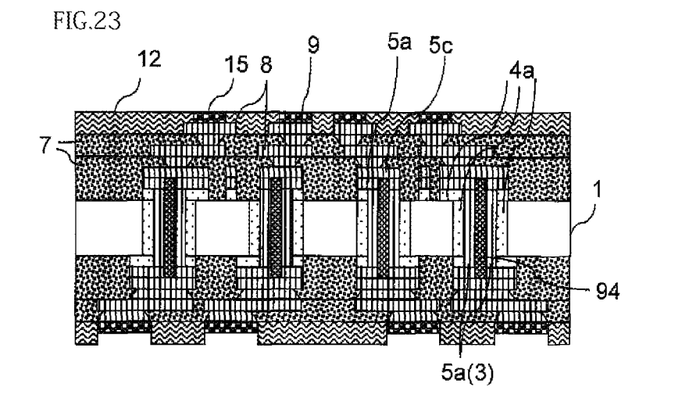
FIG. 23 is a view illustrating the method of manufacturing the wiring circuit board in the comparative example.

Next, as shown in FIG. 22, the insulative resin layer 7 was formed by laminating an ABF film (manufactured by Ajinomoto Fine-Techno Co., Inc.) made of an epoxy resin on both surfaces of the core substrate 90. Then, a via hole was formed in the insulative resin layer 7 on top of the through electrode 3 by using a UV-YAG laser. The diameter of the via hole was smaller than that of the through electrode 3. Furthermore, smears generated in the via hole during UV-YAG laser processing were cleaned by desmearing using an alkaline aqueous treatment solution.

Then, conductive vias were formed by conformal plating. The inner diameters of the conductive vias were set to 6 μm. For the wiring group 8, a non-electrolytic copper plating layer was formed as a seed layer on the insulative resin 7. Further, on the seed layer, a resist pattern in which a portion corresponding to the wiring group 8 (refer to FIG. 23) was open was formed by a negative resist. Then, using a semi-additive process, an 8 μm thick electrolytic copper plating layer was formed as a conductive material. After that, the resist and unnecessary portion of the seed layer were removed to form the wiring group 8. An LS (line space) of the wiring group 8 was set to 10 μm.

As a method of manufacturing the semiconductor device 200 of Comparative example 1, a photosensitive solder resist 12 was laminated on the substrate 1 for light exposure and development, and the conductive pad 15 was formed by Ni/Au plating on the wiring circuit board 100 manufactured by the above method of manufacturing a wiring circuit board. Then, the semiconductor element 11 was fixed to the conductive pad 15 by soldering.

Comparative Example 2

A semiconductor device according to Comparative example 2 was manufactured in a manner similar to the semiconductor device according to Comparative example 1, except that the purpose of the through hole 13 formed in the substrate 1 was only to achieve electrical conductivity, and the thermal via was not formed. The diameter of the through hole 13 formed in the substrate 1 was set to 50 μm at the top.

Comparative Example 3

A semiconductor device according to Comparative example 3 was manufactured in a similar manner to the semiconductor device according to Example 1 except that the inorganic adhesive layer 4a was not formed.

(Evaluation of Thermal Conductivity)

The thermal conductivity was evaluated using the semiconductor devices fabricated in Examples 1 and 2, and Comparative Examples 1 and 2. The thermal conductivity was evaluated by thermal resistance (Rja [° C/W]: Thermal Resistance between Junction of Semiconductor Components-Ambient Temperature). A higher thermal resistance indicates less propagation of temperature. The ambient temperature was measured using a T thermocouple (wire diameter of Φ0.8 mm, copper-constantan), and the junction temperature was measured using a thermal chip. The diode in the thermal chip was used for obtaining the junction temperature and the resistor therein was used as a heat source. The junction temperature was obtained using the voltage drop due to the temperature at both ends of the diode.

Table 1 shows the thermal resistances measured using the semiconductor devices according to Examples 1 and 2, and Comparative examples 1 and 2.

TABLE 1

|  | Thermal Resistance Rja (° C./W) |
|---|---|
| Example 1, Example 2 (With Thermal Via) | 100 |
| Comparative Example 1 (With Thermal Via) | 140 |
| Comparative Example 2 (Without Thermal Via) | 180 |

As shown in Table 1, the thermal resistance of the semiconductor device according to Examples 1 and 2 was lower than both of the semiconductor devices of Comparative examples 1 and 2. Accordingly, it was confirmed that by filling the first conductive layer 5 in the through electrode 3 with the filling resin 14 having thermal conductivity and covering the upper and lower ends of the through electrode 3 with the second conductive layer, the wiring circuit board 100 was able to dissipate heat of the semiconductor element 11 by thermal conduction via the wiring group and the through electrode 3 of the substrate 1. It was also confirmed that by filling the through electrode 3 with the filling resin 14 having a high thermal conductivity, heat resistance was improved by approximately 30% in comparison with Comparative example 1.

The semiconductor device according to Comparative example 1 had a thermal via for achieving thermal conductivity. The filling resin 94 filled in the thermal via, however, had a low thermal conductivity and the filling resin 94 with a low thermal conductivity occupied approximately 70% of the volume of the thermal via. Thus, it was confirmed that heat dissipation was low in comparison with those of Examples 1 and 2. Further, it was confirmed that the heat dissipation properties of the semiconductor device according to Comparative example 2 were low, since the thermal via was not formed therein.

In Examples 1 and 2, and Comparative examples 1 and 2, the inorganic adhesive layers 4 were formed and the conductive layers 5 were formed, thereby achieving higher adhesion to the substrate 1 made of low expansion glass. However, in Comparative example 3 with no inorganic adhesive layer 4a, there were no adhesion of the conductive layers to the substrate 1, thereby failing to obtain a wiring circuit board.

From Example 1, it was confirmed that removal of the first conductive layer on the surface of the substrate 1 and formation of the second inorganic adhesive layer and the second conductive layer 5 could lead to obtaining a wiring circuit board 100 that enabled easy control of the thickness of the conductive layers immediately above the substrate 1 and had high adhesion between the substrate 1, or the surface of the filling resin 14, and the conductive layers 5.

From Example 2, it was confirmed that thinning of the first conductive layer on the surface of the substrate 1 and formation of the second conductive layer 5 could lead to obtaining a wiring circuit board 100 that enabled omission of the step of forming the second inorganic adhesive layer and had high adhesion between the thinned first conductive layer and the second conductive layer, and high adhesion between the surface of the filling resin 14 and the second conductive layer.

As described above, according to the present invention, it is possible to dissipate the heat generated by the semiconductor element 11 to the printed board via the through electrode 3 of the wiring circuit board 100, prevent the conductive layer 5 from being detached from the substrate 1, and provide a wiring circuit board 100 and the semiconductor device 200 having higher reliability

INDUSTRIAL APPLICABILITY

The present invention can be applied to a wiring circuit board provided between a package substrate and a semiconductor element, and to a semiconductor device provided with a wiring circuit board to be connected to a semiconductor element.

REFERENCE SIGNS LIST

1: Base material
2: Electrolytic copper plating
3: Through electrode
4a: Inorganic adhesive layer (first inorganic adhesive layer)
4b: Inorganic adhesive layer (second inorganic adhesive Layer)
5a: Conductive layer (first conductive layer)
5b: Conductive layer (second conductive layer)
5c: Conductive layer (second conductive layer)
6: Land
7: Insulative resin layer
8: Wiring group
9: Conductive via hole
10: Core substrate
11: Semiconductor element
12: Solder resist
13: Through hole
14: Filling resin
15: Conductive pad
100: Wiring circuit board
200: Semiconductor device

What is claimed is:

1. A wiring circuit board having a base material with a through hole, an insulative resin layer laminated on the base material and having a conductive via formed therein, and a wiring group laminated on the insulative resin layer,
a first inorganic adhesive layer formed in the through hole;
a hollow through electrode formed by laminating a first conductive layer on the first inorganic adhesive layer;
a filling resin formed by filling a mixture of a metallic powder and a resin material in the through electrode; and
a second conductive layer covering upper and lower ends of the through electrode.

2. The wiring circuit board of claim 1, further comprising:
a second inorganic adhesive layer provided between the through electrode and the second conductive layer; and
a first wiring group provided on the second inorganic adhesive layer and having a land and a wiring.

3. The wiring circuit board of claim 1, wherein the insulative resin covering the first wiring group has a coefficient of thermal expansion which is higher than a coefficient of thermal expansion of a material forming each of the first conductive layer and the second conductive layer.

4. The wiring circuit board of claim 1, wherein the filling resin has a thermal conductivity of 1-20 W/m·k or more.

5. The wiring circuit board of claim 1, wherein the first inorganic adhesive layer is a single layer film formed of one material, or a single layer film of two or more materials, or a laminated film formed by laminating two or more materials, selected from a group consisting of tin oxide, indium oxide, zinc oxide, nickel, nickel phosphorus, chromium, chromium oxide, aluminum nitride, copper nitride, aluminum oxide, tantalum, titanium, and copper.

6. The wiring circuit board of claim 1, wherein the conductive material forming each of the first conductive layer and the second conductive layer is a metal selected from a group consisting of copper, silver, gold, nickel, platinum, palladium, ruthenium, tin, tin silver, tin silver copper, tin copper, tin bismuth, and tin lead, or a compound of two or more of these metals.

7. The wiring circuit board of claim 1, wherein the filling resin is made of a mixture of at least one metallic powder selected from a group consisting of copper, silver, gold, nickel, platinum, palladium, ruthenium, tin, tin silver, tin silver copper, tin copper, tin bismuth, and tin lead, and any resin material selected from a group consisting of an epoxy/phenol resin, a polyimide resin, a cycloolefin, and a PBO resin.

8. The wiring circuit board of claim 1, wherein the insulative resin layer is made of one or more materials selected from a group consisting of an epoxy/phenol resin, a polyimide resin, a cycloolefin, and a PBO resin.

9. The wiring circuit board of claim 1, wherein the base material is made of glass.

10. A semiconductor device, comprising:
the wiring circuit board of claim 1; and,
a semiconductor element mounted on the wiring circuit board.

* * * * *